United States Patent
Chung et al.

(10) Patent No.: US 6,447,605 B1
(45) Date of Patent: Sep. 10, 2002

(54) METHOD FOR PREPARING HETEROEPITAXIAL THIN FILM

(75) Inventors: Sung Yoon Chung, Seoul; Suk Pil Kim, Cheoungju; Byung Sung Kang, Taejeon; Si Kyung Choi, Taejeon; Suk Joong Kang, Taejeon, all of (KR)

(73) Assignee: Korea Advanced Institute of Science and Technology, Seoul (KR)

( * ) Notice: Subject to any disclaimer, the term of this patent is extended or adjusted under 35 U.S.C. 154(b) by 0 days.

(21) Appl. No.: 09/441,968

(22) Filed: Nov. 17, 1999

(51) Int. Cl.$^7$ .............................................. C30B 25/04
(52) U.S. Cl. ........................ 117/95; 117/85; 117/106; 438/492
(58) Field of Search .................. 117/8, 95, 106; 423/328.1; 438/311, 314, 341, 481, 483, 486, 492, 509, 433, 438

(56) References Cited

U.S. PATENT DOCUMENTS

| | | | |
|---|---|---|---|
| 4,717,681 A | * | 1/1988 | Curran ........................ 438/314 |
| 4,830,984 A | * | 5/1989 | Purdes ........................ 438/492 |
| 4,953,170 A | * | 8/1990 | Logan et al. .................. 372/44 |
| 5,019,529 A | * | 5/1991 | Takasaki ........................... 11/8 |
| 5,238,869 A | * | 8/1993 | Shichijo et al. ................ 11/95 |

OTHER PUBLICATIONS

Mohan Krishnamurthy [Sic: Crashnamersh] et al., "Microstructural evolution during the hereoepitaxy of Ge on vicinal Si(100)," J. Appl. Phys. 69(9), May 1, 1991, pp. 6461–6471.

R. J. Asaro et al., "Interface Morphology Development During Stress Corrosion Cracking Part I. Via Surface Diffusion," Metallurgical Transactions, col. 3, Jul. 1972, pp. 1789–1796.

A.G. Cullis, "Strain–Induced Modulations in the Surface Morphology of Heteroepitaxial Layers," MRS Bulletin, Apr. 1996, pp. 21–26.

Jong K. Lee, "A Study on Coherency Strain and Precipitate Morphology via a Discrete Atom Method," Metallurgical and Materials Transactions A, vol. 27A, Jun. 1996, pp. 1449–1459.

* cited by examiner

Primary Examiner—Felisa Hiteshew
(74) Attorney, Agent, or Firm—Knobbe, Martens, Olson & Bear, LLP

(57) ABSTRACT

Disclosed is a method for preparing heteroepitaxial thin films which are free of island structures which have a bad influence on the photoelectric properties and interfacial reactivity of the thin films. These heteroepitaxial thin films are deposited on grooved or curved surfaces of substrates. The use of grooved substrates relieves the coherent elastic strain from the thin films, thereby inhibiting the surface roughening and the island structure formation in the heteroepitaxial thin films. The method can be applied to all of the thin films that show island structures, including GaAs/Si and SiGe/Si typically used in semiconductor devices and various electronic parts, enabling the thin films to be flatly deposited at a significant thickness on various substrates without additionally processing.

19 Claims, 1 Drawing Sheet

METHOD FOR PREPARING HETEROEPITAXIAL THIN FILM

BACKGROUND OF THE INVENTION

1. Field of the Invention

The present invention relates, in general, to a method for preparing heteroepitaxial thin films and, more particularly, to the prevention of island structures from occurring in the heteroepitaxial thin films by use of grooved or curved substrates.

2. Description of Prior Arts

A thin film which is deposited on a different material substance with their lattices being of coherence, is called a heteroepitaxial thin film.

When materials are deposited on substrates by epitaxy, if the materials mismatch the substrates in lattice constant, that is, if the materials are larger or smaller in lattice constant than are the substrates, the lattice constant difference between the two subjects make coherent elastic strains existing in the formed heteroepitaxial thin films. It is well known by the teaching of Crashnamersh et al., that, in order to relax the elastic strains resulting from lattice mismatch, the epitaxial thin films get their surface to roughen, resulting in occurrence of island structures.

Now, it is recognized that the island structure of epitaxial thin films is one of the main factors which have a bad influence on the optical and electrical properties of devices such as semiconductor devices or electrical parts. In order to have superb photoelectric properties and exert a good interfacial reaction on other materials, epitaxial thin films are required to be deposited with maintenance of surface flatness. Therefore, the surface roughening mentioned above is the problem to be solved at any cost.

Since the time when Asaro and Tiller conducted the first theoretical research on the instability of the surface conformation, many researchers have studied on the microstructural change behaviors in heteroepitaxial thin films and reported the elastic strains which affect the behaviors. Must of the reports published thus far contemplate the causes of the surface roughening, for example, relations between elastic strain and stress and the resulting change in island structure, etc. However, there are found no reports regarding the techniques for preventing the causes so as to obtain planar heteroepitaxial thin films.

Typically, the suppression of the island structure is achieved by depositing a film at a critical thickness or less, lest a large quantity of elastic strain energy be accumulated in the film or by employing substrates which have similar lattice constants to those of the thin film materials. These suppression techniques, however, are not applicable where thin films are deposited at necessary thicknesses on various substrates desired, which more frequently occurs. Therefore, the conventional techniques are non-practical in most cases.

For instance, because of difficulty in achieving planar thin films upon the preparation of heteroepitaxial thin films, conventionally, tensional layers or defect annihilating grids are additionally used, as disclosed in U.S. Pat. Nos. 5,019,529, 5,238,869, 4,830,984 and 4,953,170. In addition, these prior arts are confined to the use of particular materials, for example, GaAs thin films deposited on silicon substrates.

SUMMARY OF THE INVENTION

Knowledge of the compressive stress behavior in the interface between a substrate and a deposited thin film allows the elastic strain energy existing in the thin film to be alleviated, leading to the present invention.

The intensive and thorough research on planar heteroepitaxial thin films, repeated by the present inventors aiming to enable thin films to be epitaxially deposited at a broad range of thicknesses on various substrates, resulted in the finding that the use of grooved or roughened substrates can inhibit the island structure from occurring in heteroepitaxial thin films without conducting any additional processes.

Therefore, it is an object of the present invention to overcome the above problems encountered in prior arts and to provide a method for preparing heteroepitaxial thin films which are free of island structures.

It is another object of the present invention to provide a method for preparing heteroepitaxial thin films, which enable the thin films to be flatly deposited at a significant thickness on various substrates without additionally processing.

Based on the present invention, the above objects could be accomplished by a provision of a method for preparing heteroepitaxial thin films, in which the heteroepitaxial thin films are deposited on grooved or curved surfaces of substrates.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

The present invention is characterized in that substrates are grooved at a certain size, i.e, depth and width, before being deposited with thin films.

According to a report (A. G. Cullis, MRS Bulletin, 21, p21 (1996)), the compressive stress, which occurs in the interface between a substrate and a heteroepitaxial thin film owing to the difference in lattice constant therebetween, is relieved upon surface roughening whilst the distribution curve of the stress becomes sinusoidal. Hence, if the compressive stress occurring in the interface is made sinusoidal in early stages of the thin film deposition by grooving a substrate on the basis of the stress distribution behavior, the elastic strain energy acting on the thin film is exceptionally relieved so that the surface roughening and island formation can be prevented.

Whatever materials the thin films and the substrates are, island structures are inhibited from being formed in all heteroepitaxial thin films if the substrates are grooved according to the present invention.

A better understanding of the present invention may be obtained in light of the following examples which are set forth to illustrate, but are not to be construed to limit the present invention. The following examples were conducted by computer simulation.

EXAMPLE

Computer simulation was conducted by following the discrete atom method (DAM) designed by J. K. Lee. On a substrate in which 60 atom layers were stacked with a breadth of 200 atoms, a thin film consisting of 30 atom layers was deposited, both the substrate and the thin film being electrically isotropic.

While the misfit elastic strain between the substrate and the thin film was 1% (0.01), the shear modulus of the substrate was designed to be six times larger than that of the thin film so that the elastic strain energy was exerted on the thin film. In order to observe the conformational change of the thin film attributable purely to the elastic strain energy with exclusion of surface energy influence, an examination was made at a temperature as low as 150 K.

TEST EXAMPLE

The conformational change due to the motion of atoms in the thin film was investigated using the Monte Carlo process.

Figure 1A:
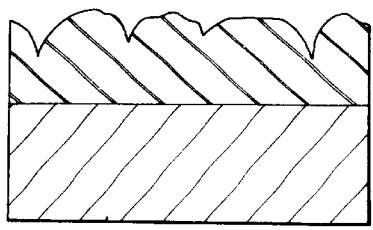
FIG. 1a is a schematic view illustrating a conformational change generated in a heteroepitaxial thin film on a flat substrata, as a computer simulation result of the atom motions during tens of millions of Monte Carlo steps.
Figure 1B:
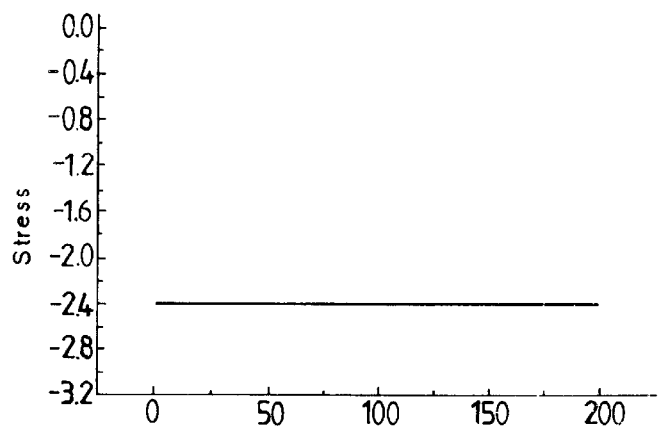
FIG. 1b shows an initial stress distribution of the heteroepitaxial thin film just after deposition, which did not experience a first Monte Carlo step.

With reference to FIG. 1, there are shown a conformational change generated on the thin film owing to the elastic strain energy, and the corresponding stress distribution. FIG. 1a shows a conformationally deformed surface of the thin film, resulting from the motion of the atoms under the simulation condition, obtained after tens of millions of Monte Carlo steps. FIG. 1b shows an initial stress distribution just after the deposition, before a first Monte Carlo step.

This computer simulation result coincides with those known from previous research reports. In order to relieve the elastic strain caused by a large compressive stress of 2.4 [J/m] between the substrate and the thin film, as seen in FIG. 1b, the thin film is deformed into the island structure shown in FIG. 1a.

Figure 2A:
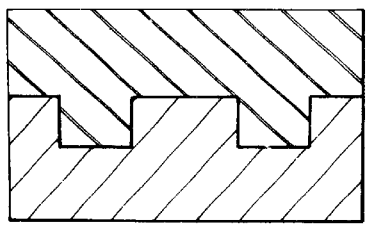
FIG. 2a is a schematic view illustrating a conformational change generated in a heteroepitaxial thin film on a substrate in which grooves with a depth of 20 atom layers and a width of 20 atom layers, as a computer simulation result of the atom motions during tens of millions of Monte Carlo steps.
Figure 2B:
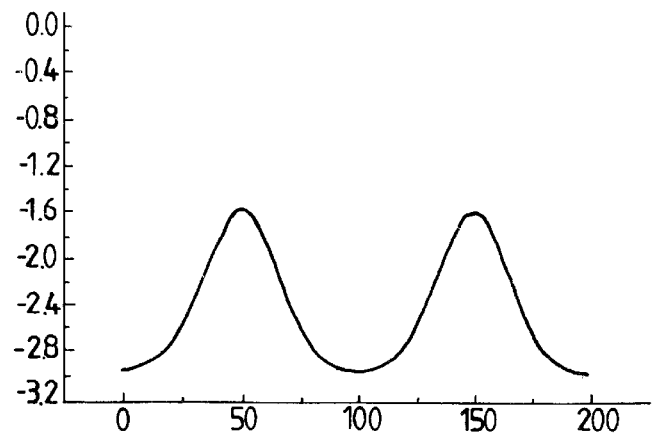
FIG. 2b shows an initial stress distribution of the heteroepitaxial thin film just after the deposition on the grooved substrate, which did not experience a first Monte Carlo step.

On the other hand, when grooves with a depth of 40 atom layers and a width of 20 atom layers were formed on the substrate under the same condition as the above, a computer simulation result was obtained as shown in FIG. 2. It is recognized from FIG. 2b that the initial stress distribution just after the deposition was relieved as compared with that of the grooveless substrate, taking a sinusoidal shape. Accordingly, the relieved stress allowed the thin film to be maintained in a flat form even after tens of millions of Monte Carlo steps, as seen in FIG. 2a.

Taken together, the computer simulation data demonstrate that the use of grooved substrates inhibit the surface roughening and the island structure formation in heteroepitaxial thin films (see, S-Y. Chung, S. P. Kim, B. S. Kang, S. K. Choi, S-J. L. Kang, and J. K. Lee, Materials Research Society, Fall Meeting Dec., 1–5, 1997, Boston Mass.).

In the above example, the grooves with a width of 40 atom layers and a depth of 20 atom layers are only illustrative, and the grooves may have any width and depth and may be made in any form, for example, squared or curved, if they are helpful in relieving the compressive strain.

As described hereinbefore, the present invention is to use non-flat, grooved or curved, substrates when depositing heteroepitaxial thin films, with the aim of relieving the coherent elastic strain from the thin films, thereby making the thin films free of the island structures which have a bad influence on the photoelectric properties and interfacial reactivity of the thin films. This technique according to the present invention can be applied to all of the thin films that show island structures, including GaAs/Si and SiGe/Si typically used in semiconductor devices and various electronic parts.

The present invention has been described in an illustrative manner, and it is to be understood the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

What is claimed is:

1. A method of forming a heteroepitaxial thin film, comprising:

preparing a first thin film of a first material, the first thin film comprising a surface;

forming a plurality of grooves on the surface of the first thin film; and depositing a second thin film of a second material over the grooved surface of the first thin film.

2. The method as defined in claim 1, wherein the plurality of the grooves are formed such that an initial stress distribution at an interface between the first and second thin films right after the deposition of the second thin film has a sinusoidal shape.

3. The method as defined in claim 2, wherein the plurality of the grooves is formed continuously on the surface of the first thin film.

4. The method as defined in claim 2, wherein the plurality of the grooves are squared or curved.

5. The method as defined in claim 1, wherein the plurality of the grooves is formed regularly on the surface of the first thin film.

6. The method as defined in claim 1, wherein the first and second materials are different from each other, but their lattices are coherent.

7. The method as defined in claim 1, wherein the first and second materials are semiconductors.

8. The method as defined in claim 7, wherein at least one of the first and second materials is a compound semiconductor.

9. A heteroepitaxial thin film comprising:

a first thin film with a first material;

a second thin film with a second material; and an interface between the first and the second thin films, wherein an initial stress distribution at the interface right after the deposition of the second material has a sinusoidal shape.

10. The heteroepitaxial thin film as defined in claim 9, wherein the interface is continuously squared or curved.

11. The heteroepitaxial thin film as defined in claim 9, wherein the interface is regularly squared or curved.

12. The heteroepitaxial thin film as defined in claim 9, wherein the first and second materials are different from each other, but their lattices are coherent.

13. The heteroepitaxial thin film as defined in claim 9, wherein the first and second materials are semiconductors.

14. The heteroepitaxial thin film as defined in claim 13, wherein at least one of the first and second materials is a compound semiconductor.

15. A thin film construction for use to form a heteroepitaxial thin film, the thin film construction comprising:
   a thin film of a material, the thin film comprising a surface; and
   a plurality of grooves formed on the surface of the thin film.

16. The thin film construction as defined in claim 15, wherein the plurality of the grooves is formed continuously on the surface.

17. The thin film construction as defined in claim 15, wherein the plurality of the grooves is formed regularly on the surface of the thin film.

18. The thin film construction as defined in claim 15, wherein the plurality of the grooves are squared or curved.

19. The thin film construction as defined in claim 15, wherein the material is a semiconductor.

* * * * *